United States Patent

Seo et al.

[11] Patent Number: 5,886,933
[45] Date of Patent: Mar. 23, 1999

[54] BOOST VOLTAGE GENERATOR FOR CONTROLLING A MEMORY CELL ARRAY

[75] Inventors: Dong-il Seo; Hyung-dong Kim, both of Suwon, Rep. of Korea

[73] Assignee: Samsung Electronics, Co. Ltd., Suwon, Rep. of Korea

[21] Appl. No.: 879,757

[22] Filed: Jun. 19, 1997

[30] Foreign Application Priority Data

Jun. 25, 1996 [KR] Rep. of Korea ................... 96-23685

[51] Int. Cl.⁶ .................................................. G11C 7/00
[52] U.S. Cl. ........................ 365/189.11; 365/189.09; 365/226
[58] Field of Search ..................... 365/189.11, 189.09, 365/226; 326/536, 589

[56] References Cited

U.S. PATENT DOCUMENTS 5,592,421  1/1997  Kaneko et al. ................. 365/189.09
5,673,232  9/1997  Furutani ....................... 365/189.07 X
5,677,889  10/1997  Haraguchi et al. .................. 365/226

*Primary Examiner*—Huan Hoang
*Attorney, Agent, or Firm*—Marger Johnson & McCollom P.C.

[57] ABSTRACT

A boost voltage generating circuit for a memory device prevents excessive voltage on a word line for a memory cell array and reduces power consumption by utilizing an internal array reference voltage signal as a reference signal for the boost voltage generating circuit. The circuit maintains the boost voltage power supply signal at a predetermined level independently of the voltage level of an internal peripheral reference voltage signal which is applied to a peripheral circuit and which can be increased to increase the speed of the memory device without causing excessive voltage on the word line. The boost voltage generating circuit includes a level detector circuit which receives the array reference voltage signal as a reference signal. The boost voltage generating circuit also includes a pulse generator and a pumping circuit which utilize the array reference voltage signal as a power supply.

13 Claims, 2 Drawing Sheets

5,886,933

BOOST VOLTAGE GENERATOR FOR CONTROLLING A MEMORY CELL ARRAY

This application corresponds to Korean Patent application No. 96-23685 filed Jun. 25, 1996 in the name of Samsung Electronics Co., Ltd. which is herein incorporated by reference for all purposes.

BACKGROUND OF THE INVENTION

1. Field of the Invention

This invention relates generally to semiconductor memory devices, and more particularly to a boost voltage generator for controlling a memory cell array.

2. Description of the Related Art

FIG. 1 is a diagram showing the general structure of a semiconductor memory device. As shown in FIG. 1, the memory device includes a plurality of memory cell array blocks 10. Each cell array block has an associated row decoder 12 for selecting a word line and column decoder 14 for selecting a bit line so as to select a memory cell within the cell array block. The memory device also includes a peripheral circuit portion 16 for controlling the operation of an internal signal.

The external power supply voltage applied to the semiconductor memory device is divided into a peripheral reference voltage signal (VREFP) which is an internal power supply signal that is applied to the peripheral circuit. The external power supply is also divided into an array reference voltage signal (VREFA) which is an internal power supply signal that is applied to the memory array circuit. The voltage level of each internal power supply is adjusted as needed. The voltage levels of these two internal power supply signals is maintained at a constant level in certain areas of the integrated circuit by maintaining the external power supply signal (VCC) at a constant level.

However, the voltage levels required for the two internal power supply signals might be different for different circumstances. For example, since the speed of the semiconductor memory device is related to the voltage level of the VREFP signal which is applied to the peripheral circuit, it is advantageous to increase the level of the VREFP signal as long as the power supply current remains within an acceptable level. Also, the current consumed by the semiconductor memory device is related to the voltage level of the VREFA signal which is applied to the memory cell array, and thus, it is advantageous to reduce the voltage level of the VREFA signal as low as possible.

FIG. 2 is a block diagram of a prior art boost voltage generator which generates a boosted power supply voltage signal (VPP). The circuit of FIG. 2 includes a level detecting portion 20, a pulse generating portion 22 and a pumping portion 24. The boosted power supply voltage signal VPP is generated from the VREFP signal (which is applied to the peripheral circuit) and controls the word lines of the semiconductor memory cell arrays.

Referring to FIG. 2, after the VREFP signal is applied to the peripheral circuit, the pulse generating portion 22 and the pumping portion 24 continuously operate to generate the boosted power supply voltage signal VPP at a predetermined voltage level. When the voltage level of the boosted signal VPP reaches the predetermined level, the level detecting portion 20 stops the operation of the pulse generating portion 22. Thus, the pumping portion 24 stops operating as well.

The level detecting portion 20 receives the boosted power supply voltage signal VPP and outputs an oscillating boosted power voltage signal (VPPOSCE). The pulse generating portion 22 generates a boosted power driving voltage signal (VPPDRV) responsive to the VPPOSCE signal. The pumping portion 24 receives the VPPDRV signal from the pulse generating portion 22 and continuously performs the pumping operation until the boosted power voltage signal VPP reaches a predetermined level. Thus, the boosted power voltage signal VPP, which is generating according to the process described above, controls the word lines of the semiconductor memory cell arrays, thereby controlling the memory cells. FIG. 3 is a schematic diagram of a prior art memory cell having a cell transistor in a general semiconductor memory device.

Referring to FIG. 3, the boosted power voltage signal VPP for controlling the cell transistor 30, which is connected to a word line W/L, should be maintained at a voltage level corresponding to the sum of the VREFP signal, a threshold voltage (VT) of the cell, and a predetermined margin voltage so that an adequate read/write operation can be performed through a full active RESTORE operation.

FIG. 4 is a schematic diagram showing the detailed structure of the level detecting portion 20 of the boost voltage generating circuit shown in FIG. 2. The signal VREFP is provided to the level detecting circuit shown in FIG. 4 and the signal VPPOSCE is output therefrom.

In the prior art level detector, the internal boosted power supply signal VPP which controls the word lines of the memory cells is generated using the VREFP signal as a power source and a reference signal. However, if the voltage level of the VREFP signal is increased to increase the speed of the semiconductor memory device, several problems occur. First, the voltage level of the boosted power supply signal VPP, which controls the word line of the chip, is increased above the required level such that an excessive voltage is applied to the wordline during normal operation. This becomes a more serious problem as the difference between the voltage levels of the two signals increases.

Second, when the voltage level of the VREFP signal increases, the boost voltage generator must operate at an excessive rate to maintain the voltage level of the boosted power supply signal VPP above the required level. This results in excessive current consumption.

Accordingly, a need remains for an improved technique for generating a boosted power supply signal for controlling a memory cell array in a semiconductor memory device.

SUMMARY OF THE INVENTION

Therefore, it is an object of the present invention to prevent excessive voltage on a word line in a semiconductor memory device.

Another object of the present invention is to reduce the current consumption of a boost voltage generator for a semiconductor memory device.

A further object of the present invention is to increase the operating speed of a semiconductor memory device.

Yet another object of the present invention is to provide a boosted power voltage generator for a semiconductor memory device for maintaining the voltage level of a boost power signal below a required level during all operational modes using an internal power voltage (VREFA) for a memory array of the semiconductor memory device.

To accomplish these and other objects, a boost voltage generating circuit constructed in accordance with the present invention prevents excessive voltage on a word line for a memory cell array and reduces power consumption by utilizing an internal array reference voltage signal as a reference signal for the boost voltage generating circuit. The boost voltage generating circuit includes a level detector circuit which receives the array reference voltage signal as a reference signal. The boost voltage generating circuit also includes a pulse generator and a pumping circuit which utilize the array reference voltage signal as a power supply.

The circuit maintains the boost voltage power supply signal at a predetermined level independently of the voltage level of an internal peripheral reference voltage signal which is applied to a peripheral circuit and which can be increased to increase the speed of the memory device without causing excessive voltage on the word line.

One aspect of the present invention is a semiconductor memory device comprising: a peripheral circuit coupled to receive a first power supply signal; a memory cell array coupled to receive a second power supply signal; and a boost voltage generator coupled to control the memory cell array; wherein the boost voltage generator is coupled to receive the second power supply signal. The boost voltage generator includes a level detecting circuit, a pulse generator, and a pumping circuit coupled to receive the second power supply signal.

Another aspect of the present invention is a method for operating a boost voltage generator in a semiconductor memory device having a first internal power supply signal, a second internal power supply signal, and a memory cell array coupled to receive a first one of the plurality of internal power supply signals and coupled to receive a boosted signal from the boost voltage generator; the method comprising using the first internal power supply signal as a reference signal for the boost voltage generator.

Using the first internal power supply signal as a reference signal for the boost voltage generator includes applying the first internal power supply signal to a level detecting circuit in the boost voltage generator. The first internal power supply signal can be used as a power supply for the boost voltage generator. Using the first internal power supply signal as a power supply for the boost voltage generator includes applying the first internal power supply signal to a pulse generator and a pumping circuit.

Another aspect of the present invention is a boosted power voltage generator for a semiconductor memory device which is divided into a plurality of memory cell array block areas and a periphery circuit area located between the memory cell array block areas. The memory array uses an internal power voltage which is divided into an array reference voltage (VREFA) that is applied to the memory cell array block areas and a peripheral reference voltage (VREFP) that is applied to the periphery circuit area. The boosted power voltage generator comprises a level detecting portion, a pulse generating portion, and a pumping portion to generate an appropriate boosted power voltage VPP, wherein the VREFA signal is applied to the level detecting portion. The VREFA signal is simultaneously applied to the level detecting portion and the pulse generating portion. The VREFA signal is also simultaneously applied to the level detecting portion, the pulse generating portion and the pumping portion.

An advantage of the present invention is that it reduces the current consumption of a memory cell array in a semiconductor memory device.

Another advantage of the present invention is that it increases the operating speed of a semiconductor memory device.

A further advantage of the present invention is that it reduces the current consumption of a boost voltage generator in a semiconductor memory device.

The foregoing and other objects, features and advantages of the invention will become more readily apparent from the following detailed description of a preferred embodiment of the invention which proceeds with reference to the accompanying drawings.

DETAILED DESCRIPTION

Figure 5:
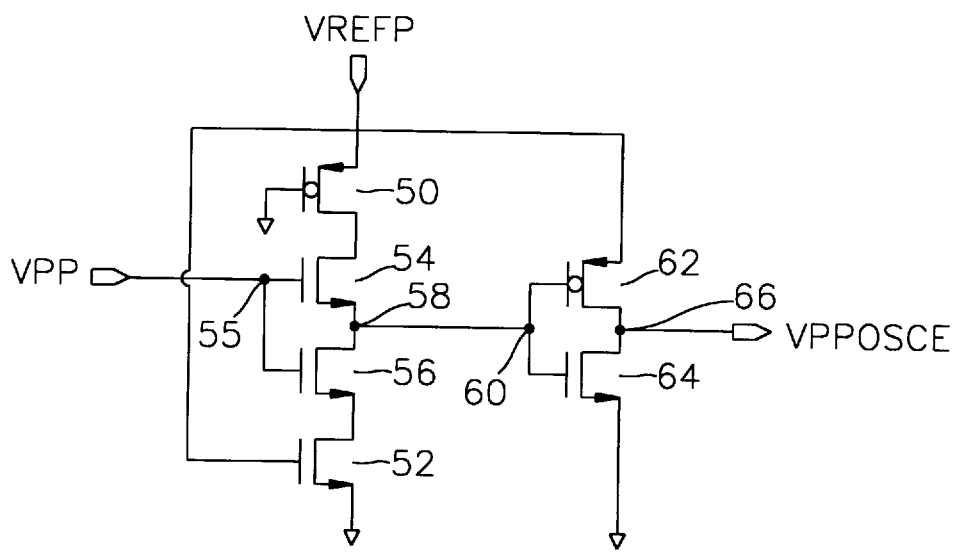
FIG. 5 is a schematic diagram of an embodiment of a level detector for a boost voltage generator constructed in accordance with the present invention.
Figure 4:
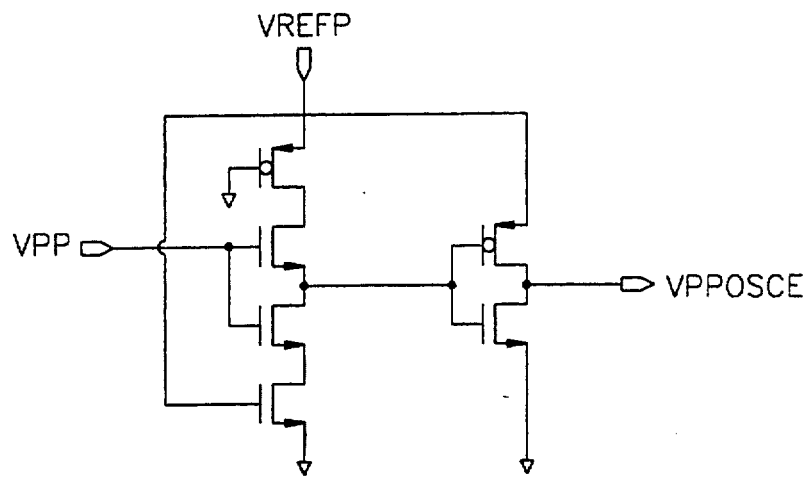
Figure 5:
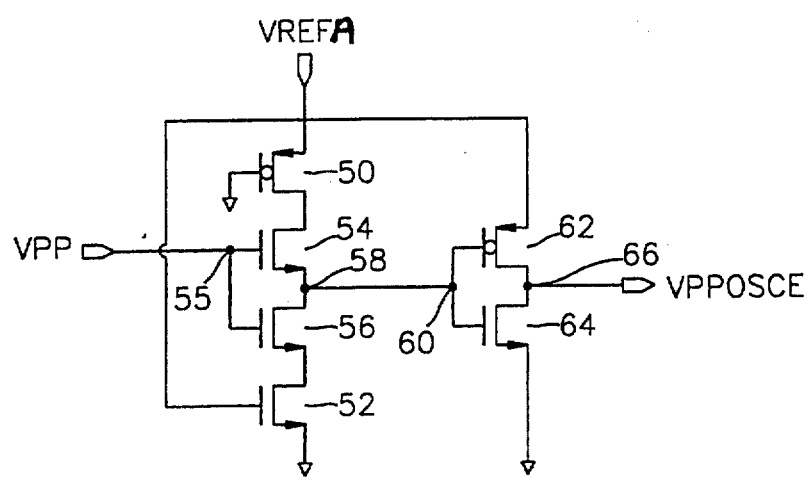

FIG. 5 is a schematic diagram of an embodiment of a level detector constructed in accordance with the present invention. The circuit of FIG. 5 can be utilized in a boost voltage generator for controlling a memory cell array. For example, the circuit of FIG. 5 can replace the conventional level detector 20 in the boost voltage generator of FIG. 2.

Figure 4:
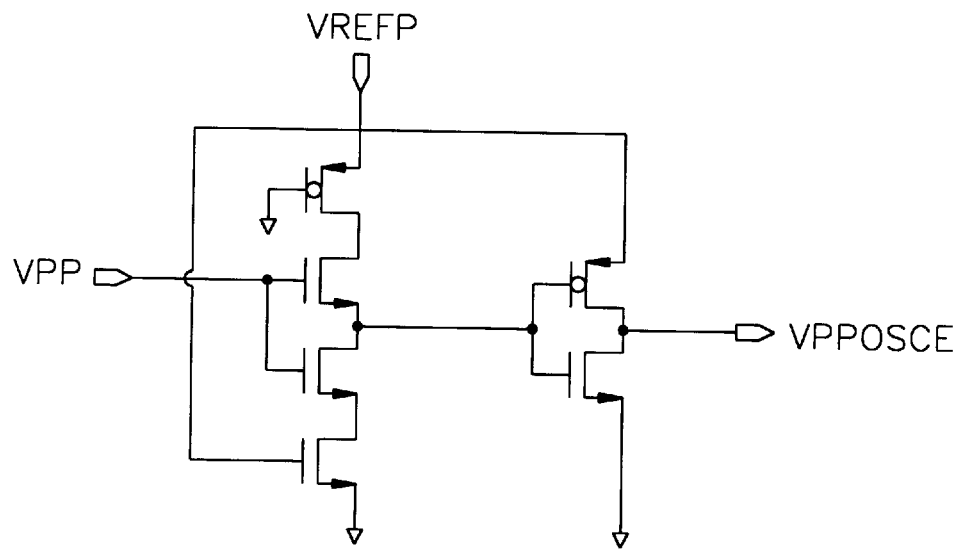
FIG. 4 is a schematic diagram showing more detail of the prior art level detector of the boost voltage generator of FIG. 2.

In the circuit of FIG. 5, the internal array reference voltage signal (VREFA), which is used for controlling the memory cell array, is applied to the source end of the level detecting circuit. This is in contrast to the prior art circuit of FIG. 4 in which the internal peripheral reference voltage signal (VREFP), which is applied to the peripheral circuit, is applied to the source end of the level detecting circuit.

The level detecting circuit of FIG. 5 includes a first PMOS transistor 50 having a source port to which the signal VREFA is applied and a gate which is grounded. The circuit also includes a first NMOS transistor 52 having a gate to which the signal VREFA is applied and a source port which is grounded. Second and third NMOS transistors 54 and 56 are serially connected to the first PMOS transistor 50 and the first NMOS transistor 52, respectively, and share a common gate connection node 55 to which a boosted power voltage VPP is applied. A second PMOS transistor 62 and fourth NMOS transistor 64 share a common gate connection node 60. Node 60 is connected to a common connection node 58 which is shared by the second and third NMOS transistors 54 and 56 which are serially connected between VREFA and ground.

An oscillating boosted power voltage signal (VPPOSCE) is output from a common connection node 66 which is shared by the second PMOS transistor 62 and the fourth NMOS transistor 64.

Figure 1:
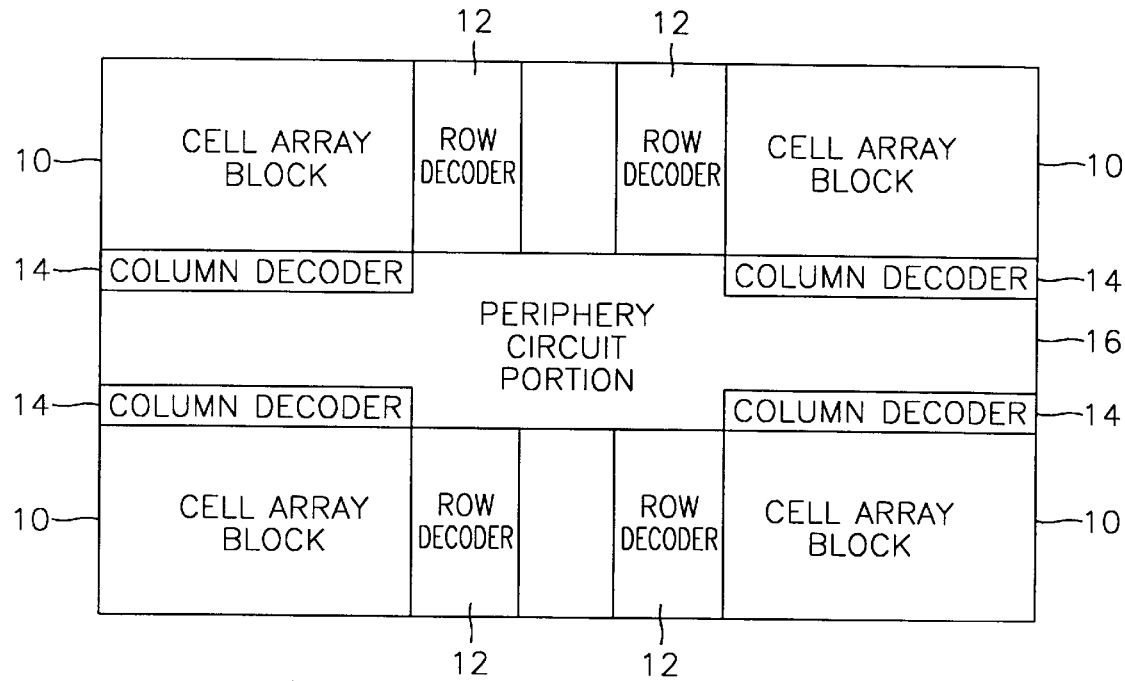
FIG. 1 is a diagram showing the general structure of a prior art semiconductor memory device.
Figure 2:
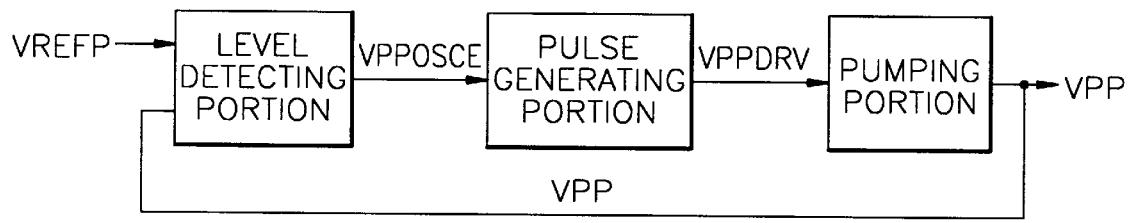
FIG. 2 is a block diagram of a prior art boost voltage generator for a semiconductor memory device.
Figure 3:
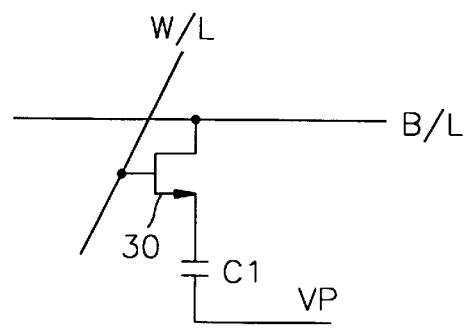
FIG. 3 is a schematic diagram showing a prior art memory cell having a cell transistor in a semiconductor memory device.

When the level detector of FIG. 5 is used to replace the prior art level detector 20 in the boost voltage generating circuit of FIG. 2, the signal VREFA, which is applied to the array circuit, is preferably also applied to the pulse generating portion 22 and the pumping portion 24 of the boosted voltage power generator shown in FIG. 2, so as to simplify the layout of the circuit.

As a consequence of applying the internal array reference voltage signal (VREFA) to the source end of the level detecting circuit of FIG. 5, the circuit maintains the voltage level of the boosted power supply signal at a predetermined value which is determined by the voltage level of the VREFA signal. As a result, the voltage level of the VREFA signal can be reduced to reduce the current consumption of the memory device while the voltage level of the VREFP signal can be increased to increase the speed of the memory device, but the voltage on the word line does not reach an excessive level. Further, the current consumption of the pumping circuit is reduced as well.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A semiconductor memory device comprising:
   a peripheral circuit coupled to receive a first power supply signal;
   a memory cell array coupled to receive a second power supply signal; and
   a boost voltage generator coupled to the memory cell array for providing a boost signal for controlling the memory cell array;
   wherein the boost voltage generator is coupled to receive the second power supply signal.

2. A memory device according to claim 1 wherein the boost voltage generator includes a level detecting circuit coupled to receive the second power supply signal.

3. A memory device according to claim 1 wherein the boost voltage generator includes a pulse generator coupled to receive the second power supply signal.

4. A memory device according to claim 1 wherein the boost voltage generator includes a pumping circuit coupled to receive the second power supply signal.

5. A method for operating a boost voltage generator for controlling a word line in a semiconductor memory device having a first internal power supply signal, a second internal power supply signal, a memory cell array coupled to receive a first one of the plurality of internal power supply signals and coupled to receive a boosted signal from the boost voltage generator, and a peripheral circuit coupled to receive a second one of the plurality of internal power supply signals, the method comprising:
   powering the memory cell array with the first internal power supply signal;
   powering the peripheral circuit with the second internal power supply signal; and
   using the first internal power supply signal as a reference signal for the boost voltage generator.

6. A method according to claim 5 wherein using the first internal power supply signal as a reference signal for the boost voltage generator includes applying the first internal power supply signal to a level detecting circuit in the boost voltage generator.

7. A method according to claim 5 further including using the first internal power supply signal as a power supply for the boost voltage generator.

8. A method according to claim 7 wherein using the first internal power supply signal as a power supply for the boost voltage generator includes applying the first internal power supply signal to a pulse generator.

9. A method according to claim 7 wherein using the first internal power supply signal as a power supply for the boost voltage generator includes applying the first internal power supply signal to a pumping circuit.

10. A boost voltage generator for controlling a word line in a semiconductor memory device which includes a plurality of memory cell array block areas, a peripheral circuit area located between said memory cell array block areas, and an internal power supply signal which is divided into an array reference voltage signal (VREFA) that is applied to said memory cell array block areas and a peripheral reference voltage signal (VREFP) that is applied to said peripheral circuit area, said boost voltage generator comprising:
    a level detecting portion;
    a pulse generating portion; and
    a pumping portion to generate a boosted power voltage signal VPP;
    wherein the array reference voltage signal is applied to said level detecting portion.

11. A boosted power voltage generator as recited in claim 10, wherein the array reference voltage signal is simultaneously applied to said level detecting portion and said pulse generating portion.

12. A boosted power voltage generator as recited in claim 10, wherein the array reference voltage signal is simultaneously applied to said level detecting portion, said pulse generating portion and said pumping portion.

13. A boosted power voltage generator as recited in claim 10, wherein said level detecting portion comprises:
    a fist PMOS transistor having a first port coupled to receive the array reference voltage signal and a second port coupled to a ground node;
    a first NMOS transistor having a first port coupled to receive the array reference voltage signal and a second port coupled to the ground node;
    a second NMOS transistor having a first port coupled to a third port of the first PMOS transistor; a second port coupled to a first common gate connection node for receiving the boosted power voltage signal, and a third port coupled to a second common gate connection node;
    a third NMOS transistor having a first port coupled to a third port of the first NMOS transistor; a second port coupled to the first common gate connection node, and a third port coupled to the second common gate connection node;
    a second PMOS transistor having a first port coupled to receive the array reference voltage signal, a second port coupled to the second common gate connection node, and a third port coupled to an output port; and
    a fourth NMOS transistor having a first port coupled to the ground node, a second port coupled to the second common gate connection node, and a third port coupled to the output port.

* * * * *

UNITED STATES PATENT AND TRADEMARK OFFICE
CERTIFICATE OF CORRECTION

PATENT NO. : 5,886,933
DATED : March 23, 1999
INVENTOR(S) : Dong-il SEO et al.

It is certified that error appears in the above-indentified patent and that said Letters Patent is hereby corrected as shown below:

In the drawings, Sheet 2, Fig. 5, reference indicator "VREFP" should read --VREFA--.

Signed and Sealed this

Fifteenth Day of May, 2001

Attest:

NICHOLAS P. GODICI

Attesting Officer      Acting Director of the United States Patent and Trademark Office